(12) United States Patent
Huang et al.

(10) Patent No.: US 10,422,836 B2
(45) Date of Patent: Sep. 24, 2019

(54) DEVICE AND METHOD FOR ESTIMATING STATE-OF-HEALTH OF BATTERY

(71) Applicant: Automotive Research & Testing Center, Lugong (TW)

(72) Inventors: Chung-Che Huang, Lugong (TW); Po-Hsu Lin, Lugong (TW); Zhi-Rong Wang, Lugong (TW)

(73) Assignee: AUTOMOTIVE RESEARCH & TESTING CENTER, Lugong (TW)

( * ) Notice: Subject to any disclaimer, the term of this patent is extended or adjusted under 35 U.S.C. 154(b) by 467 days.

(21) Appl. No.: 15/393,622

(22) Filed: Dec. 29, 2016

(65) Prior Publication Data

US 2018/0188329 A1    Jul. 5, 2018

(51) Int. Cl.
*G01R 31/36* (2019.01)
*G01R 31/392* (2019.01)
*G01R 31/374* (2019.01)

(52) U.S. Cl.
CPC ....... *G01R 31/392* (2019.01); *G01R 31/3648* (2013.01); *G01R 31/374* (2019.01)

(58) Field of Classification Search
CPC . G01R 31/392; G01R 31/374; G01R 31/3648
See application file for complete search history.

(56) References Cited

U.S. PATENT DOCUMENTS 8,872,481 B2    10/2014    Chawla et al.

FOREIGN PATENT DOCUMENTS

| CN | 103492893 B | 9/2015 |
| CN | 102959418 B | 4/2016 |
| CN | 103760493 B | 6/2016 |

*Primary Examiner* — Regis J Betsch
*Assistant Examiner* — Jeremy A Delozier
(74) *Attorney, Agent, or Firm* — Brinks Gilson & Lione

(57) ABSTRACT

A device for estimating a state-of-health (SOH) of a battery module controls a battery current to have a predetermined current value for a testing period such that a battery voltage decreases during the testing period, corrects a voltage variation value of the battery module during the testing period according to a temperature value of the battery module, and estimates the SOH of the battery module according to the corrected voltage variation value, a current variation value of the battery module during the testing period, and a rated capacity of the battery module.

13 Claims, 5 Drawing Sheets

DEVICE AND METHOD FOR ESTIMATING STATE-OF-HEALTH OF BATTERY

FIELD

The disclosure relates to a device and a method for estimating a state-of-health of a battery module.

BACKGROUND

Technologies associated with electric vehicles have been more and more popular due to environmental and energy-saving consciousness.

In a conventional method for estimating the state-of-health of a rechargeable battery module in an electric vehicle, the rechargeable battery module should be fully charged at first, and is then discharged using a predetermined current, making the conventional method time-consuming. In addition, discharging of the rechargeable battery module may lead to risk concerning safety. In another conventional method, a voltage is inputted into the rechargeable battery module first, and then an expensive, dedicated high-frequency measuring equipment is used for measuring internal resistance of the rechargeable battery module, thereby estimating the state-of-health of the rechargeable battery module. Furthermore, the abovementioned two conventional methods require disassembly of the rechargeable battery module, resulting in inconvenience for users.

SUMMARY

Therefore, an object of the disclosure is to provide a device and a method for estimating a state-of-health of a battery module, and the device may alleviate at least one of the drawbacks of the prior art.

According to the disclosure, the device includes a control module, a correction module and a processing unit. The control module is disposed to receive information associated with a state of the battery module. When the battery module is being charged, the control module outputs, immediately after a beginning of a predetermined testing period at which the charging of the battery module has reached a predetermined target, a control signal for controlling a battery current flowing through the battery module to have a predetermined current value for the predetermined testing period, such that a battery voltage of the battery module decreases during the predetermined testing period. The correction module is disposed to receive information associated with a temperature of the battery module, is coupled to the control module for receiving the control signal, and is configured to be triggered by the control signal to acquire a voltage correction value according to a temperature value of the battery module during the predetermined test period. The processing unit is disposed to receive information associated with the battery current and the battery voltage, is coupled to the control module and the correction module for receiving the control signal and the voltage correction value respectively, and is configured to be triggered by the control signal to acquire a current variation value and a voltage variation value of the battery module during the predetermined testing period, to correct the voltage variation value based on the voltage correction value, and to estimate the state-of-health of the battery module according to the voltage variation value thus corrected, the current variation value, and a rated capacity of the battery module.

According to the disclosure, the method includes steps of:
(A) determining, based on a sensed signal that indicates a voltage, a current, a state of charging and a temperature of the battery module, whether or not charging of the battery module has reached a predetermined target; (B) outputting, immediately after a beginning of a predetermined testing period at which determination in step (A) is made to be affirmative, a control signal for controlling a battery current flowing through the battery module to have a predetermined current value for the predetermined testing period, such that a battery voltage of the battery module decreases during the predetermined testing period; (C) acquiring, based on the sensed signal, a current variation value and a voltage variation value of the battery module during the predetermined testing period; (D) acquiring, based on the sensed signal, a voltage correction value according to a temperature value of the battery module during the predetermined test period; and (E) correcting the voltage variation value based on the voltage correction value, and estimating the state-of-health of the battery module according to the voltage variation value thus corrected, the current variation value, and a rated capacity of the battery module.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
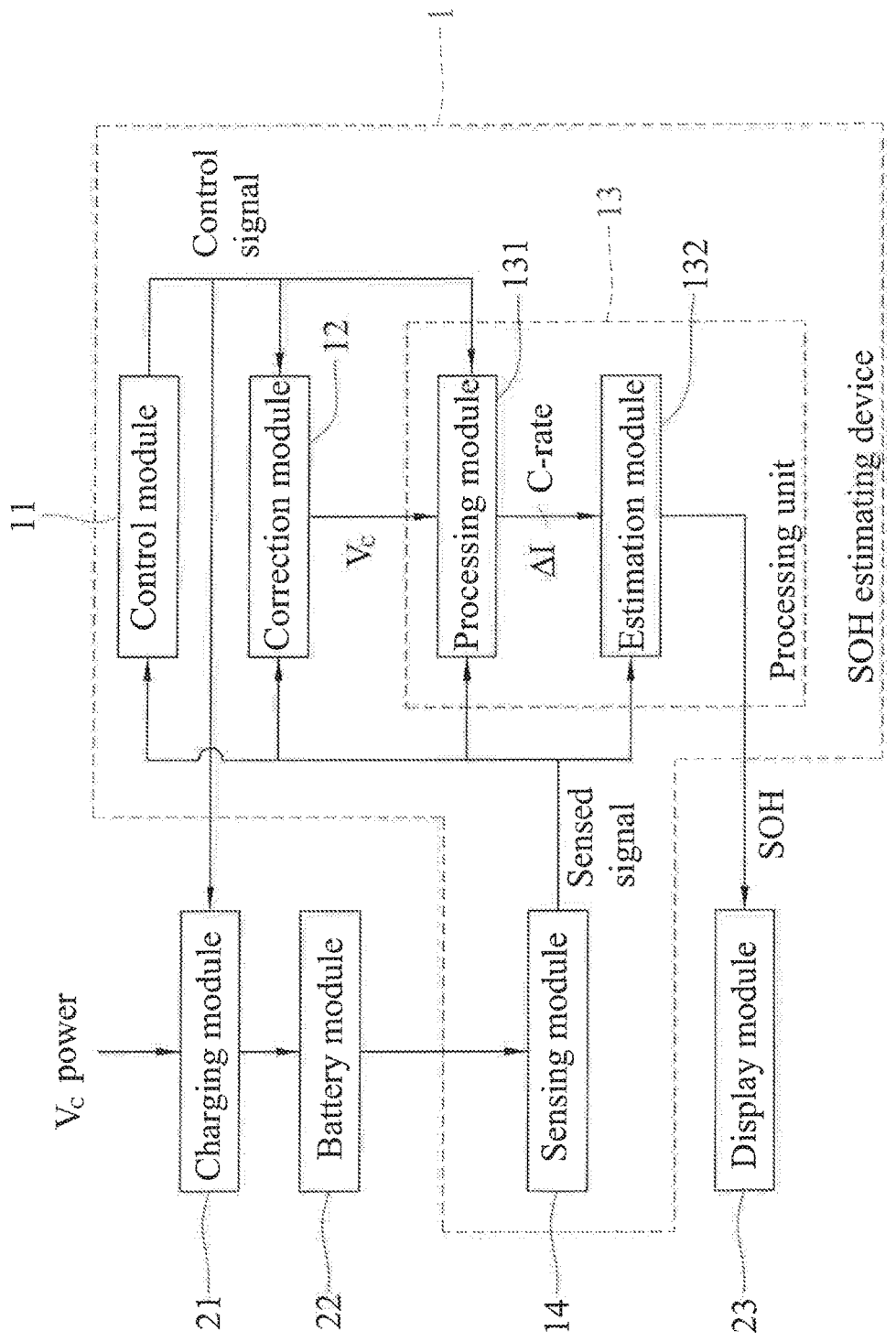
FIG. 1 is a block diagram illustrating an embodiment of a state-of-health (SOH) estimation device for estimating an SOH of a battery module according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, the embodiment of the state-of-health (SOH) estimating device 1 for estimating an SOH of a battery module 22 is adapted to be installed in a vehicle (not shown). The vehicle includes a charging module 21 (e.g., a charger), the battery module 22 (e.g., a rechargeable battery pack) that is coupled to the charging module 21, and a display module 23. The charging module 21 receives and converts alternating current (AC) power into direct current (DC) power for charging the battery module 22, and is operable to adjust a DC battery current flowing through the battery module 22. It is noted that the vehicle may be an all-electric vehicle or a hybrid electric vehicle in the form of for example, a motorcycle, a car, a bus, etc., and the disclosure is not limited to such.

In this embodiment, the SOH of the battery module 22 is represented using a quality factor relative to an ideal state thereof expressed by a percentage, where 100% represents that the battery module 22 is in a state matching a specification thereof. Ideally, the SOH of the battery module 22 is 100% when the battery module 22 is just manufactured, and decreases over time and with use. In this embodiment, the SOH estimating device 1 includes a control module 11, a correction module 12, a processing unit 13 and a sensing module 14. It is noted that the control module 11, the correction module 12 and the processing unit 13 may be integrally realized using a microcontroller but this disclosure is not limited thereto.

Figure 3:
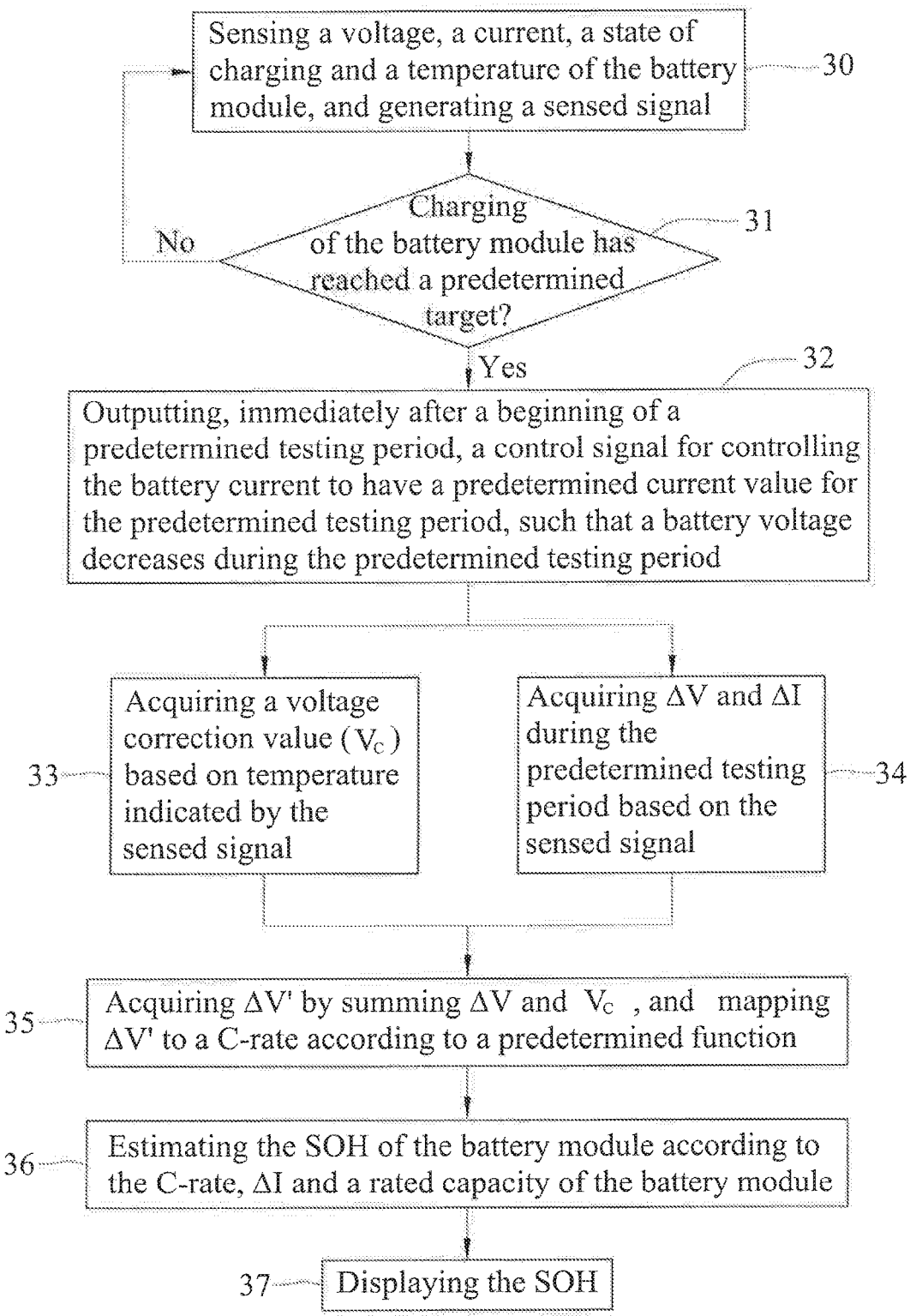
FIG. 3 is a flow chart illustrating steps of a method implemented using the embodiment of the device for estimating the SOH of a battery module.

Further referring to FIG. 3 that illustrates a method for estimating the SOH of the battery module 22 using the SOH estimating device 1, the sensing module 14 is coupled to the battery module 22, periodically/continuously senses a voltage (e.g., using a voltage sensor), a current (e.g., using a current sensor), a state of charging (e.g., based on the sensed voltage and current) and a temperature (e.g., using a temperature sensor) of the battery module 22, and generates a sensed signal indicating the voltage, the current, the state of charging and the temperature of the battery module 22 (step 30).

The control module 11 is coupled to the charging module 21 and the sensing module 14, receives the sensed signal from the sensing module 14, and determines, based on the state of charging of the battery module 22 indicated by the sensed signal, whether or not charging of the battery module 22 (which is being charged) has reached a predetermined target (step 31). The predetermined target may be, but is not limited to, a battery charge ranging between 70% and 80%, and is 70% in this embodiment. The control module 11 outputs, immediately after a beginning of a predetermined testing period (Tt, exemplified as 256 seconds) at which it is determined that the charging of the battery module 22 has reached the predetermined target, a control signal to the charging module 21 for controlling the battery current to have a predetermined current value (It) for the predetermined testing period (Tt), such that a battery voltage of the battery module 22 decreases during the predetermined testing period (Tt) (step 32). The predetermined current value (It) may cause the battery module 22 to be neither being charged nor discharged (i.e., the predetermined current value (It) being zero) in one embodiment, may cause the battery module 22 to keep being charged in another embodiment, and may cause the battery module 22 to be discharged in yet another embodiment. The flow goes back to step 30 when it is determined in step 31 that charging of the battery module 22 has not reached the predetermined target.

The correction module 12 is coupled to the control module 11 and the sensing module 14 for receiving the control signal and the sensed signal respectively, is triggered by the control signal to acquire, based on the temperature indicated by the sensed signal, a temperature value of the battery module 22 during the predetermined test period (Tt), and acquires a voltage correction value according to the temperature value of the battery module 22 (step 33). It is noted that temperature variation of the battery module 22 during the predetermined testing period (Tt) should be small, so the voltage correction value may be acquired according to the temperature sensed at any time point during the predetermined testing period (Tt).

In this embodiment, the correction module 12 acquires the voltage correction value according to $$V_c = a \times (T_1 - T_0)^2 - b \times (T_1 - T_0) + c \qquad (1)$$

where $V_c$ represents the voltage correction value, $T_1$ represents the temperature value of the battery module 22 during the predetermined testing period (Tt), $T_0$ represents a predetermined temperature value (e.g., 25° C.), and a, b, c are respectively a first predetermined constant, a second predetermined constant and a third predetermined constant. The constants a, b, c are determined according to a charging state of the battery module 22. For example, when the charging state of the battery module 22 is at 70%, the constants a, b, c are respectively $2 \times 10^{-5}$, 0.0022 and 0.0825, and thus $V_c = 2 \times 10^{-5} \times (T_1 - T_0)^2 - 0.0022 \times (T_1 - T_0) + 0.0825$; and when the charging state of the battery module 22 is at 80%, the constants a, b, c are respectively $3 \times 10^{-5}$, 0.0024 and 0.08881, and thus $V_c = 3 \times 10^{-5} \times (T_1 - T_0)^2 - 0.0024 \times (T_1 - T_0) + 0.0881$. In other words, different charging states of the battery module 22 correspond to different predetermined sets of the constants a, b, c.

It is noted that, in other embodiments, equation (1) may be replaced by:

$$V_c = -d \times (T_1 - T_0) + e \qquad (2)$$

where $V_c$ represents the voltage correction value, $T_1$ represents the temperature value of the battery module 22 during the predetermined testing period, $T_0$ represents a predetermined temperature value, and d, e are respectively a fourth predetermined constant and a fifth predetermined constant. In such a case, the constant d may be 0.008 when the predetermined target is a battery charge of 70% or 80%, while the constant e is determined according to the predetermined target. For example, when the predetermined target is a battery charge of 70%, the constant e is 0.0629, and thus $V_c = -0.008 \times (T_1 - T_0) + 0.0629$; and when the predetermined target is a battery charge of 80%, the constant e is 0.0667, and thus $V_c = -0.008 \times (T_1 - T_0) + 0.0667$.

Figure 2:
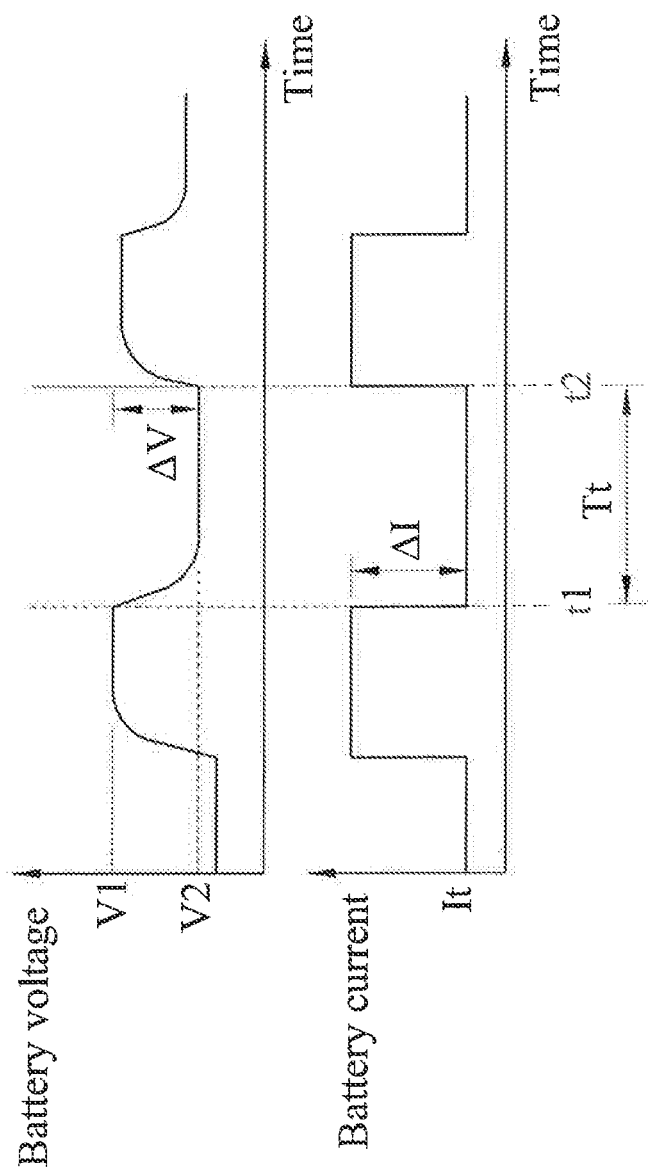
FIG. 2 is a waveform plot illustrating voltage and current variation of the battery module during the estimation process.

The processing unit 13 includes a processing module 131 and an estimation module 132. The processing module 131 is coupled to the correction module 12, the control module 11 and the sensing module 14 for receiving the voltage correction value ($V_c$), the control signal and the sensed signal respectively. Further referring to FIG. 2, the processing module 131 is triggered by the control signal to perform: (1) acquiring, based on the voltage indicated by the sensed signal, a voltage variation value ($\Delta V$) of the battery module 22 during the predetermined testing period (Tt); (2) acquiring, based on the current indicated by the sensed signal, a current variation value ($\Delta I$) of the battery module 22 during the predetermined testing period (Tt) (step 34); (3) correcting, based on the voltage correction value ($V_c$), the voltage variation value ($\Delta V$) that may deviate due to the temperature (i.e., T1) of the battery module 22; and (4) mapping, according to a predetermined function, the voltage variation value thus corrected to a C-rate that is a measure of the rate at which the battery module 22 is charged/discharged relative to its maximum capacity and that is associated with a charging/discharging current of the battery module 22 (step 35). It is noted that the voltage variation value ($\Delta V$) is a voltage difference (i.e., V1−V2) between the battery voltage at the beginning (t1) of the predetermined testing period (Tt) and the battery voltage at an end (t2) of the predetermined testing period (Tt), and the current variation value ($\Delta I$) is a current difference between the predetermined current value (It) and a current value of the battery current at the beginning (t1) of the predetermined testing period (Tt).

In this embodiment, the processing module 131 corrects the voltage variation value by summing up the voltage correction value ($V_c$) and the voltage variation value ($\Delta V$), thereby obtaining a corrected voltage variation value ($\Delta V'$) (i.e., $\Delta V' = V_c + \Delta V$). The predetermined function may be, for example, $CR = a' \times \Delta V' \times b'$, where CR represents the C-rate of the battery module 22, a' is a sixth predetermined constant, and b' is a seventh predetermined constant. The predetermined function may be derived from measurements relevant to the battery module 22.

The estimation module 132 is coupled to the processing module 131 for receiving the current variation value (ΔI) and the C-rate (CR), estimates the SOH of the battery module 22 according to the C-rate, the current variation value (ΔI) and a rated capacity of the battery module 22 (step 36), and outputs the estimated SOH to the display module 23 for being displayed thereby (step 37). The estimation module 132 may also be coupled to the sensing module 14 for receiving the sensed signal that may also indicate a number of charge-discharge cycles of the battery module 22, thereby estimating a remaining lifetime of the battery module 22, but this disclosure is not limited thereto.

In this embodiment, the estimation module 132 estimates the SOH of the battery module 22 according to $$SOH=[(\Delta I/CR)/AH\_spec]\times 100\%\times K^{-1} \quad (3)$$

where SOH represents the state-of-health of the battery module 22, ΔI represents the current variation value, AH_spec represents the rated capacity of the battery module 22, and $K^{-1}$ represents a predetermined deviation constant. It is noted that the rated capacity of the battery module 22 may be obtained from a specification of the battery module 22. It is noted that equation (3) may be established with measurements at two different temperatures. The predetermined temperature value ($T_0$) used in equation (1) is associated with the temperatures at which the measurements for establishing equation (3) are performed.

Figure 4:
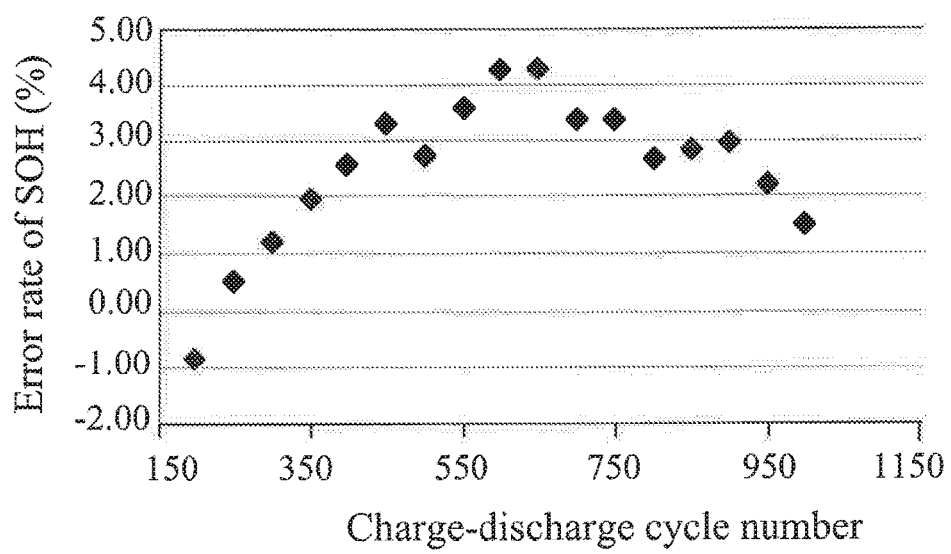
FIG. 4 is a plot illustrating error rates of the SOH estimated using the embodiment of the device.
Figure 5:
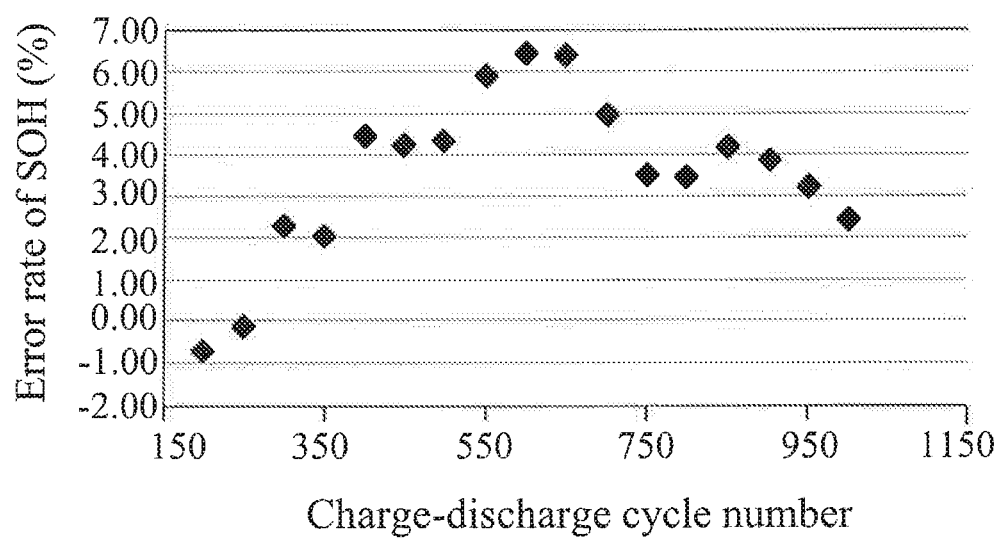
FIG. 5 is a plot illustrating error rates of the SOH estimated using the embodiment of the device with a correction module thereof being omitted.

FIG. 4 illustrates error rates of the SOH estimated using the SOH estimating device 1 that includes the correction module 12 to correct error of the voltage variation value (ΔV) resulting from the temperature, and FIG. 5 illustrates error rates of the SOH estimated using the SOH estimating device 1 with the correction module 12 being omitted. It is noted that the error rates of the SOH is defined by subtracting the SOH estimated by the SOH estimating device 1 (with or without the correction module 12) from the SOH actually measured by discharging the battery module 22, and one charge-discharge cycle refers to discharging the battery module 22 from a fully-charged state to a cut-off voltage of the battery module 22, and the following charging of the battery module 22 back to the fully-charged state.

In FIG. 4 of which the results are obtained with the voltage variation value (ΔV) being corrected to ΔV', the error rate ranges between −0.86 and 4.23% (i.e., a total range of 5.09%), and an average error rate is 2.59%. On the other hand, as shown in FIG. 5 of which the results are obtained without the voltage value variation (ΔV) being corrected, the error rate ranges between −0.81 and 6.44% (i.e., a total range of 7.25%), and an average error rate is 3.66%. Accordingly, by virtue of the correct ion module 12 correcting the voltage variation value (ΔV) to ΔV', the SOH may be estimated more precisely with a smaller range of error rate, a lower average error rate, and a smaller maximum error rate.

In summary, the embodiment of the SOH estimating device 1 for estimating the SOH of the battery module 22 according to this disclosure may have the following advantages:

1. The SOH estimating device 1 may estimate the SOH of the battery module 22 by direct control of the charging module 21 without disassembly of the battery module 22 from the vehicle, facilitating user operation.

2. The SOH estimating device 1 does not require fully discharging of the battery module 22 for estimating the SOH of the battery module 22, thereby saving time and enhancing safety.

3. The SOH estimating device 1 changes the battery voltage by changing the battery current, corrects the voltage variation value (ΔV), and estimates the SOH of the battery module 22 according to equation (3), so an additional dedicated high frequency measurement equipment that is used to measure internal resistance of a rechargeable battery module for SOH estimation is not required, thereby saving cost.

4. Under different temperature conditions, the battery module 22 may have different voltage responses, resulting in error of the voltage variation value (ΔV), which may adversely affect precision of the SOH estimation. The SOH estimating device 1 uses the correction module 12 to correct the voltage variation value (ΔV) to alleviate affects of the temperature, thereby promoting precision of the estimated SOH of the battery module 22.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A device for estimating a state-of-health of a battery module, said device comprising:
   a control module disposed to receive information associated with a state of the battery module, wherein, when the battery module is being charged, said control module outputs, immediately after a beginning or a predetermined testing period at which the charging of the battery module has reached a predetermined target, a control signal for controlling a battery current flowing through the battery module to have a predetermined current value tor the predetermined testing period, such that a battery voltage of the battery module decreases during the predetermined testing period;
   a correction module disposed to receive information associated with a temperature of the battery module, coupled to said control module for receiving the control signal, and configured to be triggered by the control signal to acquire a voltage correction value according to a temperature value of the battery module during the predetermined test period; and
   a processing unit disposed to receive information associated with the battery current and the battery voltage, coupled to said control module and said correction module for receiving the control signal and the voltage correction value respectively, and configured to be triggered by the control signal to acquire a current variation value and a voltage variation value of the battery module during the predetermined testing period, to correct the voltage variation value based on the voltage correction value, and to estimate the state-of-health of the battery module according to the voltage variation value thus corrected, the current variation value, and a rated capacity of the battery module.

2. The device of claim 1, wherein said correction module is configured to acquired the voltage correction value according to $$V_c = a \times (T_1 - T_0)^2 - b \times (T_1 - T_0) + c$$

where $V_c$ represents the voltage correction value, $T_1$ represents the temperature value of the battery module during the predetermined testing period, $T_0$ represents a predetermined temperature value, and a, b, c are respectively a first predetermined constant, a second predetermined constant and a third predetermined constant.

3. The device of claim 1, wherein said correction module is configured to acquired the voltage correction value according to $$V_c = -d \times (T_1 - T_0) + e$$

where $V_c$ represents the voltage correction value, $T_1$ represents the temperature value of the battery module during the predetermined testing period, $T_0$ represents a predetermined temperature value, and d, e are respectively a first predetermined constant and a second predetermined constant.

4. The device of claim 1, wherein the current variation value is a current difference between the predetermined current value and a current value of the battery current at the beginning of the predetermined testing period, and the voltage variation value is a voltage difference between the battery voltage at the beginning of the predetermined testing period and the battery voltage at an end of the predetermined testing period.

5. The device of claim 1, wherein said processing unit includes:
a processing module disposed to receive information associated with the battery current and the battery voltage, coupled to said control module and said correction module for receiving the control signal and the voltage correction value respectively, and configured to be triggered by the control signal to acquire the voltage variation value and the current variation value, to correct the voltage variation value based on the voltage correction value, and to acquire a C-rate according to the voltage variation value thus corrected; and
an estimation module coupled to said processing module for receiving the current variation value and the C-rate, and configured to estimate the state-of-health according to the C-rate, the current module.

6. The device of claim 5, wherein said processing module is configured to correct the voltage variation value by summing up the voltage correction value and the voltage variation value, and to map the voltage variation value thus corrected to the C-rate according to a predetermined function.

7. The device of claim 5, wherein said estimation module is configured to estimate the state-of-health according to $$SOH = [(\Delta I / CR) / AH\_spec] \times 100\% \times K^{-1}$$

where SOH represents the state-of-health, $\Delta I$ represents the current variation value, AH_spec represents the rated capacity of the battery module, and $K^{-1}$ represents a predetermined deviation constant.

8. The device of claim 1, further comprising:
a sensing module to be coupled to the battery module for periodically sensing a voltage, a current, a state of charging and a temperature of the battery module, and configured to generate a sensed signal indicating the voltage, the current, the state of charging and the temperature of the battery module, and coupled to said control module, said correction module and said processing unit for providing the sensed signal thereto.

9. A method for estimating a state-of-health of a battery module, said method being implemented by a device for estimating the state-of-health of the battery module, and comprising steps of:
(A) determining, based on a sensed signal that indicates a voltage, a current, a state of charging and a temperature of the battery module, whether or not charging of the battery module has reached a predetermined target;
(B) outputting, immediately after a beginning of a predetermined testing period at which determination in step (A) is made to be affirmative, a control signal for controlling a battery current flowing through the battery module to have a predetermined current value for the predetermined testing period, such that a battery voltage of the battery module decreases during the predetermined testing period;
(C) acquiring, based on the sensed signal, a current variation value and a voltage variation value of the battery module during the predetermined testing period;
(D) acquiring, based on the sensed signal, a voltage correction value according to a temperature value of the battery module during the predetermined test period; and
(E) correcting the voltage variation value based on the voltage correction value, and estimating the state-of-health of the battery module according to the voltage variation value thus corrected, the current variation value, and a rated capacity of the battery module.

10. The method of claim 9, wherein, in step (D), the voltage correction value is acquired according to $$V_c = a \times (T_1 - T_0)^2 - b \times (T_1 - T_0) \times c$$

where $V_c$ represents the voltage correction value, $T_1$ represents the temperature value of the battery module during the predetermined testing period, $T_0$ represents a predetermined temperature value, and a, b, c are respectively a first predetermined constant, a second predetermined constant and a third predetermined, constant.

11. The method of claim 9, wherein, in step (D), the voltage correction value is acquired according to $$V_c = -d \times (T_1 - T_0) + e$$

where $V_c$ represents the voltage correction value, $T_1$ represents the temperature value of the battery module during the predetermined testing period, $T_0$ represents a predetermined temperature value, and d, e are respectively a first predetermined constant and a second predetermined constant.

12. The method of claim 9, wherein step (E) includes sub-steps of:
(E1) correcting the voltage variation value by summing up the voltage correction value and a value of the voltage variation value, and mapping the voltage variation value thus corrected to a C-rate according to a predetermined function; and
(E2) estimating the state-of-health according to the C-rate, the current variation value and the rated capacity of the battery module.

13. The method of claim 12, wherein, in sub-step (E2), the state-of-health is estimated according to $$SOH = [(\Delta I/CR)/AH\_spec] \times 100\% \times K^{-1}$$

where SOH represents the state-of-health, $\Delta I$ represents the current variation value, AH_spec represents the rated capacity of the battery module, and $K^{-1}$ represents a predetermined deviation constant.

* * * * *

UNITED STATES PATENT AND TRADEMARK OFFICE
CERTIFICATE OF CORRECTION

PATENT NO. : 10,422,836 B2
APPLICATION NO. : 15/393622
DATED : September 24, 2019
INVENTOR(S) : Chung-Che Huang et al.

It is certified that error appears in the above-identified patent and that said Letters Patent is hereby corrected as shown below:

In the Claims

In Claim 5 (Column 7), Line 52, insert --variation value and the rated capacity of the battery-- between "current" and "module";

In Claim 10 (Column 8), Line 43, at the end of the formula, delete "×c" and insert in its place --+c--.

Signed and Sealed this
Tenth Day of December, 2019

Andrei Iancu
*Director of the United States Patent and Trademark Office*